Figure 1:
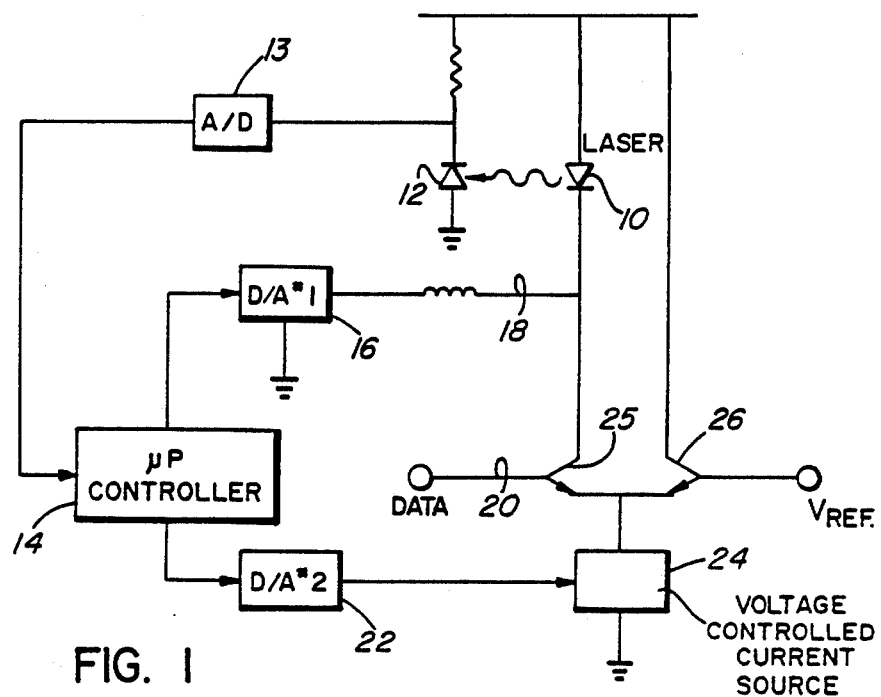

United States Patent [19]

Giles

[11] Patent Number: 4,612,671

[45] Date of Patent: Sep. 16, 1986

[54] LASER TRANSMITTER

[75] Inventor: Clinton R. Giles, Ottawa, Canada

[73] Assignee: Northern Telecom Limited, Montreal, Canada

[21] Appl. No.: 666,155

[22] Filed: Oct. 29, 1984

[51] Int. Cl.[4] .............................. H01S 3/00; H04B 9/00
[52] U.S. Cl. ........................................ 455/609; 372/38; 455/613
[58] Field of Search ................... 332/7.51; 372/25, 29, 372/30, 31, 33, 38; 455/606, 607, 608, 609, 613, 617, 618

[56] References Cited

U.S. PATENT DOCUMENTS 4,081,670  3/1978  Albanese .............................. 372/38
4,344,173  8/1982  Straus .................................. 372/38

FOREIGN PATENT DOCUMENTS 1101923  5/1981  Canada ................................ 372/38

Primary Examiner—Joseph A. Orsino, Jr.
Attorney, Agent, or Firm—Stuart L. Wilkinson

[57]  ABSTRACT

In a fiber optic laser controller for use in digital transmission a digital data stream and a DC bias are applied to the laser. During a monitoring period, the DC bias is stepped from a zero to a peak current. At a first threshold current, lasing occurs in response to digital '1' modulating current but not in response to digital '0' modulating current. At a second higher threshold current lasing occurs in response to both digital '1' and '0'. The threshold currents are identifiable as peaks in the second derivative $d^2L/dI^2$ where L is the light output for an applied bias current I. A feedback circuit including a photodiode, D/A and A/D converters and a microprocessor controller are used to maintain the bias current at the second threshold current in spite of changes in the laser characteristics caused by device aging or temperature change.

9 Claims, 2 Drawing Figures

U.S. Patent  Sep. 16, 1986  4,612,671

LASER TRANSMITTER

This invention relates to a controller for use in a stabilizing operation of a semiconductor laser used in fiber optic digital transmission systems.

In fiber optic telecommunications systems which use semiconductor lasers as light sources, it is desirable to maintain a DC bias to the laser to maintain it at its lasing threshold position. If the laser is biased much below its threshold current, then when a modulating signal is applied to the laser to drive it above the threshold current, a turn-on delay results. In high bit rate transmission, this turn-on delay is untenable. On the other hand, if the laser is usually biased above the threshold current then the extinction ratio, i.e. the ratio of light output when a signal is applied to the laser to that where no signal is applied, is correspondingly low.

A problem with semiconductor lasers is that the threshold current is not stable. As the laser ages or changes temperature, its threshold current can shift. Consequently, a means of monitoring the position of threshold and making an appropriate adjustment in a laser driver circuit is required.

One method of maintaining the semiconductor laser at the threshold position is disclosed in U.S. Pat. No. 4,344,173 assigned to the present assignee. Using this method a small amplitude test signal is applied to the laser close to threshold and a distortion component at a harmonic of the test signal frequency is monitored in the laser light output. Depending on the order of the harmonic, the distortion component has either a peak or zero value when the threshold current is applied to the laser. A feedback circuit ensures that the bias current applied to the laser is of a value which ensures that peak or zero value in the harmonic.

To maintain the DC bias current at the threshold current, the test signal spectrum must be properly interleaved with the data spectrum and specific filtering is necessary to obtain the data.

A laser controller is now proposed which is particularly adapted for high bit rate digital systems and which obviates the need for generation of a test signal and superimposition of that signal on the laser bias.

According to one aspect of the invention, there is provided a controller for use in a digital transmission system, the controller comprising:
  means for applying a bias current to the laser;
  means for increasing the bias current from a low value below laser threshold to a high value above laser threshold;
  means for applying a digital data stream to the laser;
  means for monitoring laser light output power;
  means for storing monitored light output data (L) as a function of bias current data (I);
  means for processing the stored data:
  (i) to derive a second derivative $d^2L/dI^2$ of the L-I curve;
  (ii) to find first and second peaks in the derivative, the first peak at a bias current $I_1$th corresponding to a lowest bias current at which digital '1' but not '0' produces lasing and the second peak corresponding to the lowest bias current $I_0$th at which digital '0' produces lasing; and
  means for setting the bias current at or close to $I_0$th.

According to another aspect of the invention there is provided a method of controlling a semiconductor laser for use in digital transmission systems, the method comprising:
  applying a bias current to the laser;
  increasing the bias current from a low value below laser threshold to a high value above laser threshold;
  applying a digital data stream to the laser;
  monitoring laser light output power;
  storing monitored light output data (L) as a function of bias current data (I);
  processing the stored data;
  (i) to derive a second derivative $d^2L/dI^2$ of the L-I curve;
  (ii) to find first and second peaks in the derivative, the first peak at a bias current $I_1$th corresponding to a lowest bias current at which digital '1' but not '0' produces lasing and the second peak corresponding to the lowest bias current $I_0$th at which digital '0' produces lasing; and
  setting the bias current at or close to $I_0$th.

Figure 2:
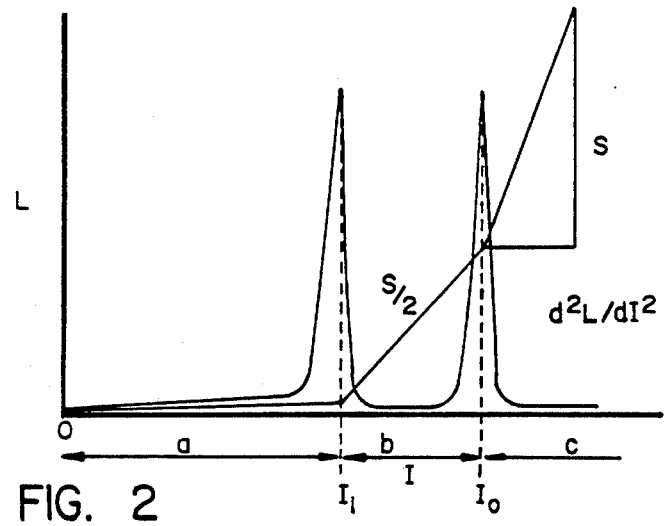

An embodiment of the invention will now be described by way of example, with reference to the accompanying drawings in which:

FIG. 1 is a block schematic view showing a laser controller according to the invention; and FIG. 2 is a graphical representation of semiconductor laser light output characteristics when used in a digital system.

Referring in detail to FIG. 1, there is shown a semiconductor laser 10 to which a bias current 18 and digital data 20 are applied. The laser has an output from a front facet to a transmission fiber (not shown) and also an output from a back facet, to a PIN photodiode 12. The photodiode output is converted to digital data with an analogue-to-digital converter 13 and the light output data is input to a microprocessor controller 14. The microprocessor controller is programmed to generate a corresponding digital output which is converted in the digital-to-analogue converter 16 to generate laser bias current 18.

Referring to FIG. 2, there is shown a plot of DC laser current/average light output power for a semiconductor laser. When modulated by digital data, the laser has three operating regimes indicated as a, b and c in FIG. 2. At low laser current (a), the laser output is principally spontaneous emission. At high bias current level (c) the laser cavity has sufficient gain to fully lase, the laser differential efficiency i.e. dL/dI having a slope 's' as shown in the Figure.

In digital transmission systems, digital '0's are represented by a low laser light output level and digital '1's are represented by a high output level. Assuming, as is the case in practice, that the modulation signal has a 50% duty cycle, the differential slope in the central region (b) is approximately s/2 because in this regime, the laser current during digital '1's is sufficient to bias the laser above threshold but at digital '0' no lasing occurs. At the lowest bias current $I_0$th at which digital '0' causes lasing, the slope efficiency changes suddenly from approximately s/2 to s.

Since best laser device performance is achieved when the current corresponding to digital '0' is near the laser threshold position $I_0$th, it is this light output transition which is detected by the controller. As indicated previously a significant laser turn-on delay occurs if the laser is biased too far below $I_0$th during digital '0' transmission. Also if digital '0' results in a bias current which is above $I_0$th, an extinction ratio penalty is incurred. Thus I at digital '0' equals $I_{0th}$ is desired for optimum operation of a laser transmitter.

The controller of FIG. 1 is used to ensure that the laser average power slope efficiency is just beginning to make the transition from s/2 to s. As shown superimposed on the main plot of I against L in FIG. 2, a very strong signature of this transition is obtained using the microprocessor controller by numerically calculating the second derivative of the laser's L-I curve during digital modulation. As illustrated there is a peak in the $d^2L/dI^2$ plot at the position where current corresponding to digital '1' is at threshold $I_{1th}$ and a second peak at the position where current corresponding to digital '0' is at threshold $I_{0th}$.

In the operation of the FIG. 1 circuit, the laser bias from the D/A converter 16 is stepped in equispaced current intervals under the control of a sub routine stored in the microprocessor controller from zero to some peak value while a digital modulation current is applied to the laser. At the same time, the average light output is monitored by photodiode 12 and corresponding bias current (I) data and light output (L) data is accummulated within a memory section of the microprocessor controller 14. From the accummulated data the second derivative of the L-I curve is calculated, the position of the second peak in the $d^2L/dI^2$ plot is identified. Using a further sub-routine stored by the microprocessor, the bias current is set at the current value $I_0$ corresponding to that identified peak. A suitable microprocessor program sequence is as follows:

1. Accumulate laser L-I data with bias currents from 0 mA to 200 mA.
2. Smooth data with a 1-2-1 weighting i.e.

$$4x_i = x_{i-1} + 2x_i + x_{i+1}.$$

3. Calculate second derivative with a 5 point least squares routine:

$$\frac{d^2x_i}{dI^2} = -x_{i-2} + 16x_{i-1} - 30x_i + 16x_{i+1} - x_{i+2}$$

4. Locate first and second maxima of $$\frac{d^2x_i}{dI^2}$$

and ajust laser current to second current value.

5. Calculate two second derivatives from four consecutive laser bias points using the formula:

$$\frac{d^2x_i}{dI^2} = x_{i-1} - 2x_i + x_{i+1}$$

6. Adjust laser current to point of largest second derivative as obtained from step 5.
7. Repeat step 5.

Supervisory and protection circuits used in fiber optic links normally include microprocessor use. A single microprocessor controller used in a time sharing mode can provide both supervision/protection and the laser stabilization of the present invention since laser performance need only be monitored on a periodic basis. A particular property of the controller described is that it is applicable to any digital data rate up to many Gb/s. In a practical environment the controller is implemented as a circuit card optionally with supervisory and protection circuit for the fiber optic link. The same card suffices for any laser transmitter regardless of the transmission bit rate.

A particular advantage over known laser monitoring schemes is that the monitoring photodiode need not be high bandwidth. Data acquisition can be done at several times per second or less.

As is well known, semiconductor lasers as they age not only undergo a change of threshold position but also undergo a change in laser slope efficiency 's'. The control loop of FIG. 1 is modified to provide an average power monitoring capability to derive modulation current control. The light power level sensed by the microprocessor controller is compared to a predetermined required power level. A second output port of the microprocessor controller 14 controls a second D/A converter 22 which sets the current at a voltage controlled current source 24. The current source in turn sets the peak-to-peak current level of the digital modulation signal applied at a transistor 25 to bring the average laser output power to the required level. Transistors 25 and 26 to which a reference voltage is applied function as a differential switch to ensure that current is switched through laser 10 when data pulses are applied at transistor 25.

What is claimed is:

1. A laser controller for use in a digital transmission system, the controller comprising:
    means for applying a bias current to the laser;
    means for increasing the bias current from a low value below laser threshold to a high value above laser threshold;
    means for applying a digital data stream to the laser;
    means for monitoring laser light output power;
    means for storing monitored light output data (L) as a function of bias current data (I);
    means for processing the stored data:
    (i) to derive a second derivative $d^2L/dI^2$ of the L-I curve;
    (ii) to find first and second peaks in the derivative, the first peak at a bias current $I_{1th}$ corresponding to a lowest bias current at which digital '1' but not '0' produces lasing and the second peak corresponding to the lowest bias current $I_{0th}$ at which digital '0' produces lasing; and
    means for setting the bias current at or close to $I_{0th}$.

2. A laser controller as claimed in claim 1 in which the means for applying a bias current includes a microprocessor controller, a D/A converter and a filter element.

3. A laser controller as claimed in claim 2 in which the means for increasing the bias current includes a sub-routine in the microprocessor controller operating to change the D/A converter output in equispaced current intervals.

4. A laser controller as claimed in claim 1 in which the means for monitoring laser light output power includes a photodiode positioned to receive light from a reverse facet of the laser, primary laser output light being directed from a front facet of the laser into an optical waveguide.

5. A laser controller as claimed in claim 4 in which the means for monitoring light output power further includes an A/D converter having an input from the photodiode and an output to a microprocessor controller.

6. A laser controller as claimed in claim 5 in which the means for storing monitored light output (L) data and bias current (I) data is a memory section within the microprocessor controller.

7. A laser controller as claimed in claim 3 in which means for setting the bias current at or close to $I_0$th is a further sub-routine in the microprocessor controller operating to set the output of the D/A converter in response to an input to the microprocessor controller from the means for monitoring laser light output power.

8. A laser controller as claimed in claim 1 further including a comparator for comparing data corresponding to average monitored light output level to data representing a desired average light output level, and means for adjusting the peak-to-peak level of the applied digital data stream to set the average monitored light output to said desired level.

9. A method of controlling a semiconductor laser for use in digital transmission systems, the method comprising:
 applying a bias current to the laser;
 increasing the bias current from a low value below laser threshold to a high value above laser threshold;
 applying a digital data stream to the laser;
 monitoring laser light output power;
 storing monitored light output data (L) as a function of bias current data (I);
 processing the stored data:
  (i) to derive a second derivative $d^2L/dI^2$ of the L-I curve;
  (ii) to find first and second peaks in the derivative, the first peak at a bias current $I_1$th corresponding to a lowest bias current at which digital '1' but not '0' produces lasing and the second peak corresponding to the lowest bias current $I_0$th at which digital '0' produces lasing; and
 setting the bias current at or close to $I_0$th.

* * * * *